United States Patent
Hirigoyen et al.

(10) Patent No.: US 9,595,552 B2
(45) Date of Patent: Mar. 14, 2017

(54) METHOD OF SIMULTANEOUSLY MANUFACTURING PARTIALLY SHIELDED PIXELS

(71) Applicant: STMicroelectronics (Grenoble 2) SAS, Grenoble (FR)

(72) Inventors: Flavien Hirigoyen, Grenoble (FR); Emilie Huss, Saint Paul de Varces (FR)

(73) Assignee: STMICROELECTRONICS (GRENOBLE 2) SAS, Grenoble (FR)

( * ) Notice: Subject to any disclaimer, the term of this patent is extended or adjusted under 35 U.S.C. 154(b) by 4 days.

(21) Appl. No.: 14/642,100

(22) Filed: Mar. 9, 2015

(65) Prior Publication Data

US 2015/0295003 A1 Oct. 15, 2015

(30) Foreign Application Priority Data

Apr. 14, 2014 (FR) ..................................... 14 53318

(51) Int. Cl.
  *H01L 27/146* (2006.01)
(52) U.S. Cl.
  CPC .... *H01L 27/14623* (2013.01); *H01L 27/1463* (2013.01); *H01L 27/14603* (2013.01); *H01L 27/14683* (2013.01); *H01L 27/14685* (2013.01)
(58) Field of Classification Search
  CPC ......... H01L 27/14623; H01L 27/14603; H01L 27/14683; H01L 27/1463; H01L 27/14685
  See application file for complete search history.

(56) References Cited

U.S. PATENT DOCUMENTS

| | | | | |
|---|---|---|---|---|
| 2002/0104995 A1* | 8/2002 | Yamazaki | ........... | H01L 27/3265 257/72 |
| 2011/0109776 A1 | 5/2011 | Kawai | | |
| 2013/0235237 A1* | 9/2013 | Aoki | ................ | H01L 27/14625 348/294 |
| 2015/0145083 A1* | 5/2015 | Chou | ................ | H01L 27/14645 257/432 |

OTHER PUBLICATIONS

INPI Search Report and Written Opinion for FR 1453318 dated Dec. 9, 2014 (9 pages).

* cited by examiner

*Primary Examiner* — Wasiul Haider
(74) *Attorney, Agent, or Firm* — Gardere Wynne Sewell LLP

(57) ABSTRACT

A method of simultaneously manufacturing First and second pixels respectively shielded on a first and on a second side are simultaneously manufactured using a process wherein a first insulator is deposited on an active area. A first metal level is deposited and defined, with a first mask, to form a shield on the first side of the first pixel and on the second side of the second pixel, and a line opposite to the shield. A second insulator is deposited, and via openings therein are defined, with a second mask. An overlying second metal level is deposited and defined, with a third mask, to form two connection areas covering the via openings on each side of the first and second pixels. The second and third masks are identical for the first and second pixels.

16 Claims, 5 Drawing Sheets

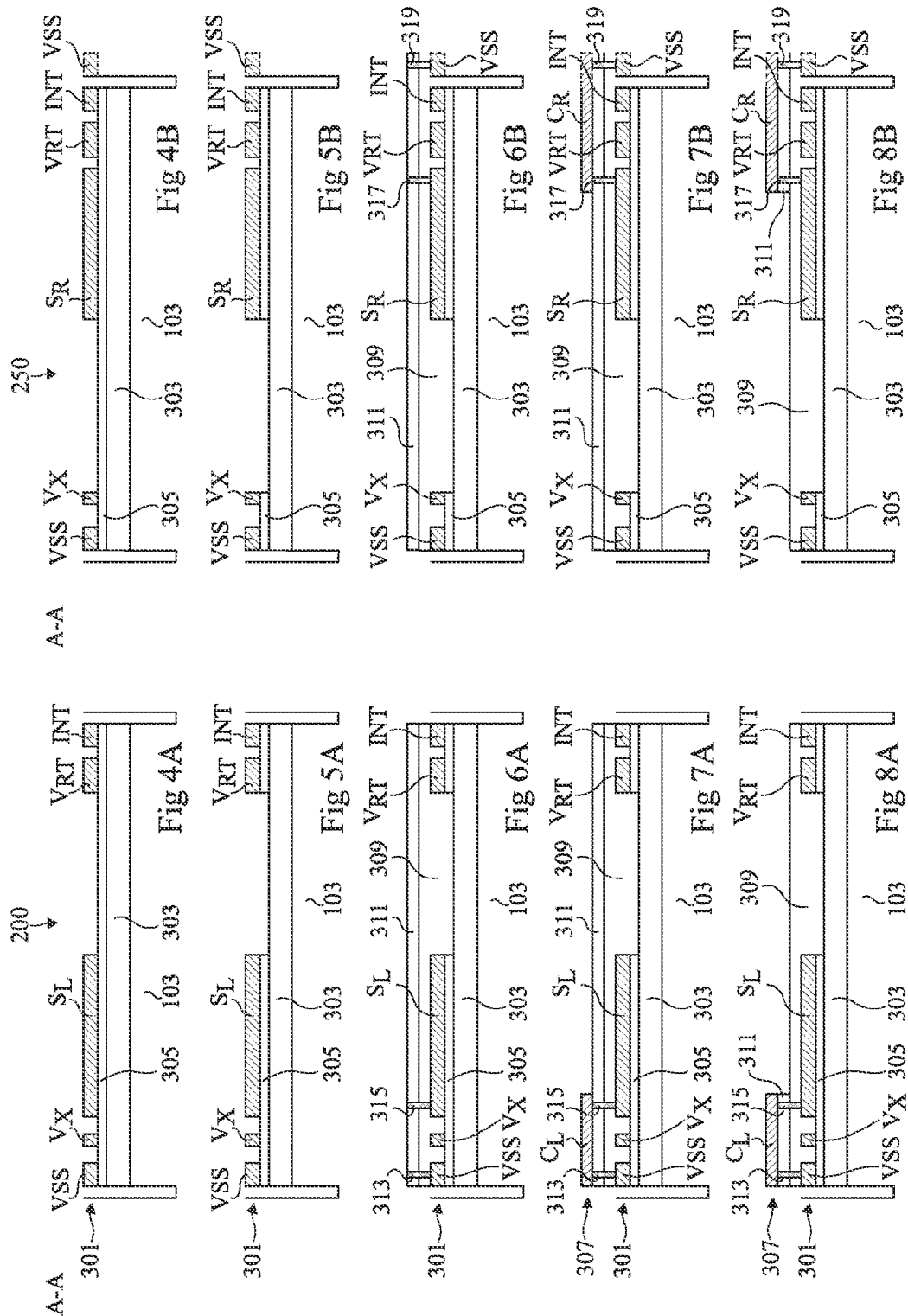

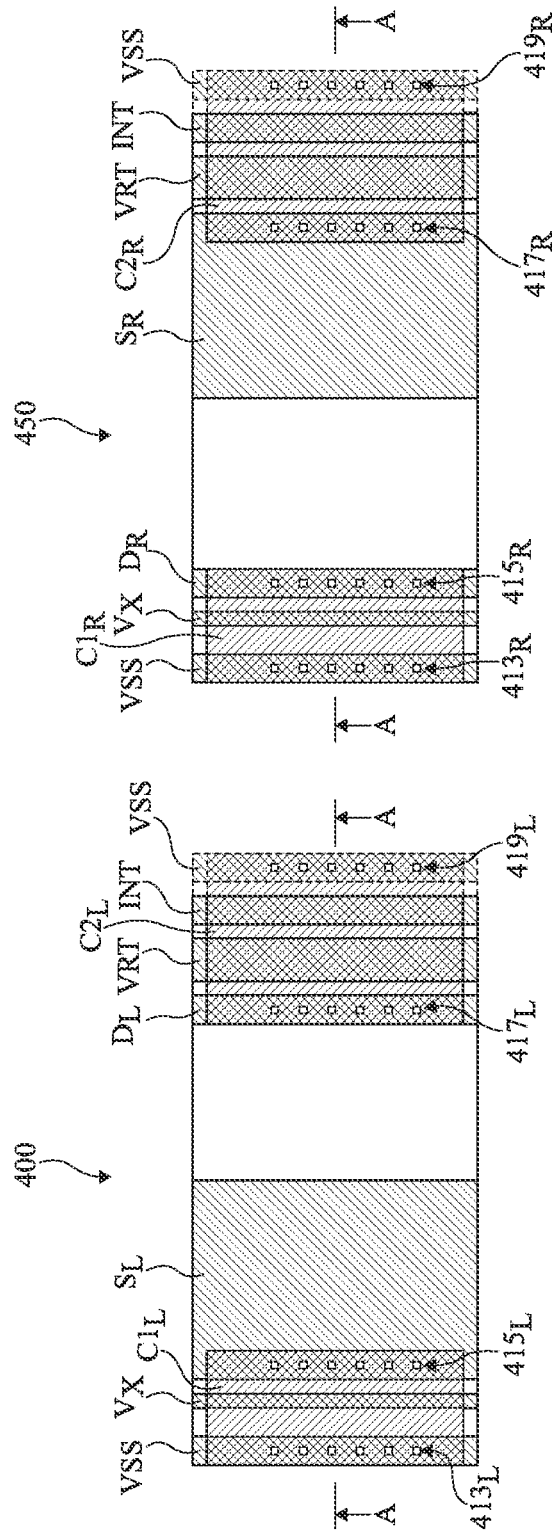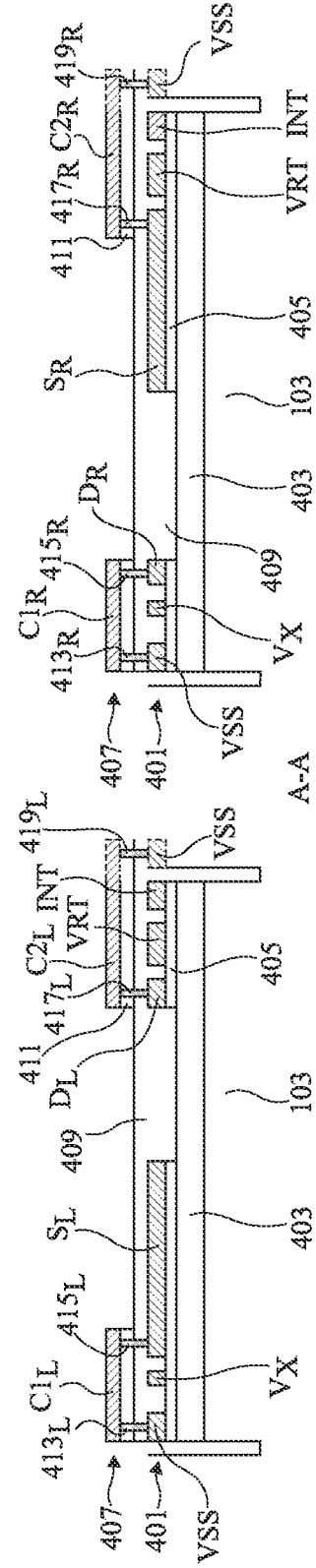

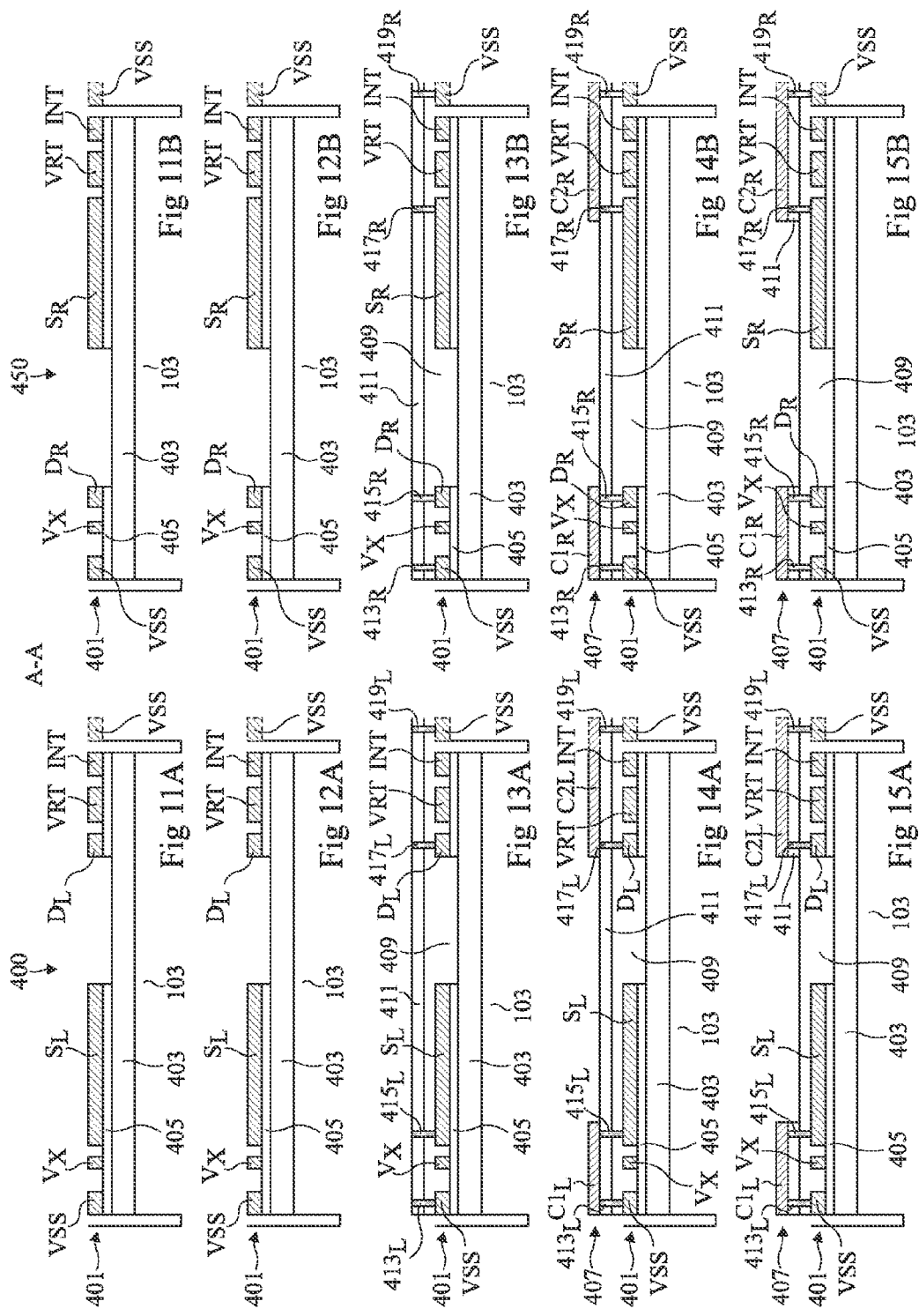

METHOD OF SIMULTANEOUSLY MANUFACTURING PARTIALLY SHIELDED PIXELS

PRIORITY CLAIM

This application claims the priority benefit of French Application for Patent No 1453318, filed on Apr. 14, 2014, the contents of which is hereby incorporated by reference in its entirety to the maximum extent allowable by law.

TECHNICAL FIELD

The present disclosure relates to a method for simultaneously manufacturing a first pixel and a second pixel respectively shielded on a first side and on a second side.

BACKGROUND

In a pixel array, a pixel comprises, in a semiconductor substrate, a main region corresponding to a photodiode and various regions corresponding to transistor drains/sources. The case where each pixel is associated with an interconnection network comprising two metal levels is considered herein.

FIG. 1 shows an example of a pixel read circuit. Circuit 100 comprises a photodiode 103 coupled to a read node INT via a transfer transistor 105, for example, a MOS transistor, capable of receiving on its gate a transfer voltage TG. A power supply voltage VRT is coupled to node INT via a transistor 107 capable of receiving a reset voltage RST on its gate. A transistor 109 has its drain coupled to power supply voltage VRT, its gate coupled to node INT, and its source coupled to an output node $V_X$ via a read transistor 111 capable of receiving a read voltage RD on its gate. The reference voltage of circuit 100 is ground VSS.

In certain pixel arrays, it is provided to insert self-focusing pixels. A self-focusing pixel is a pixel intended to receive only light arriving under a given incidence.

Based on pixels receiving light under different incidences, a focus determination can be performed. Self-focusing pixels comprise shields covering substantially complementary portions of the photodiodes of these pixels, for example, a right-hand portion and a left-hand portion. A self-focusing pixel shielded on the left-hand side (called left-hand pixel hereafter) and a self-focusing pixel shielded on the right-hand side (hereafter, the right-hand pixel) are here distinguished.

The manufacturing of similar pixel arrays comprising "normal" pixels and self-focusing pixels is here considered, the self-focusing pixels being located in determined and identical cells in each array. However, in practice, according to the specific processing unit adopted by a user, the user desires for the left-hand and right-hand pixels to be distributed differently inside of the determined cells which are assigned thereto.

SUMMARY

It is desired to simultaneously manufacture a left-hand and a right-hand pixel while providing the smallest possible number of different masks to decrease the manufacturing costs of a plurality of similar pixel arrays, comprising self-focusing pixels with different distributions.

Thus, an embodiment provides a method of simultaneously manufacturing a first pixel and a second pixel respectively shielded on a first side and on a second side, comprising the steps of:

a) depositing a first insulator on an active area;

b) depositing a first metal level and defining therein, with a first mask, a shield on the first side of the first pixel and on the second side of the second pixel, and a line opposite to the shield, the outer limit of the shield and the line being at equal distance from the center of each pixel, the screen and the line being symmetrical for the first and second pixels;

c) depositing a second insulator and defining therein, with a second mask, openings for vias crossing the first insulator all the way to the shield and to the line; and d) depositing a second metal level and defining therein, with a third mask, two connection areas covering the via openings on each side of the first and second pixels, where each of the second and third masks is identical for the first and second pixels.

According to an embodiment, the first insulator comprises a first insulating layer covered with a second insulating layer, and the second insulator comprises a third insulating layer covered with a fourth insulating layer, this method comprising the steps of:

e) etching, with a fourth mask, between steps b) and c), the second insulating layer between the shield and the line; and f) etching, with a fifth mask, after step d), the fourth insulating layer between connection areas, where the fifth mask is identical for the first and second pixels.

According to an embodiment, additional lines are formed between the shield and an outer limit of the first and second pixels, and between the line opposite to the shield and another outer limit of the first and second pixels.

Another embodiment provides an array of photodiodes comprising first and second pixels respectively shielded on a first side and on a second side, wherein the first pixel comprises on the first side, in a first metal level, a first shield substantially covering half of the pixel, and a first line between an outer limit of the first shield and a corresponding outer limit of the pixel and, in a second metal level, a first connection area connected by first and second vias to the first line and to the outer limit of the first shield; and, on the second side, in the first metal level a second line in an area corresponding to a portion of the surface area occupied by a second shield in the second pixel and, in the second metal level, a second connection area adjacent to the other outer limit of the pixel and connected by third vias to the second line; the second pixel comprises a first line, first and second connection area, and first, second, and third vias at the same locations as in the first pixel; and on the first side, in the first metal level, a third line in contact with fourth vias located at the same locations as the second vias and, on the second side, a second shield having its outer limit in contact with fifth vias located at the same locations as the third vias.

According to an embodiment, the first pixel comprises additional lines between the first line and the first shield, and between the second line and the outer limit of the pixel; and the second pixel comprises additional lines between the second line and the third line, and between the second shield and the outer limit of the pixel.

BRIEF DESCRIPTION OF THE DRAWINGS

The foregoing and other features and advantages will be discussed in detail in the following non-limiting description of specific embodiments in connection with the accompanying drawings, wherein:

FIGS. 4A to 8A and 4B to 8B are cross-section views along plane AA of FIGS. 2A and 2B, showing successive steps of an example of simultaneous manufacturing of left-hand and right-hand pixels;

FIGS. 9A and 9B are top views showing an embodiment of a left-hand pixel and of a right-hand pixel;

FIGS. 10A and 10B are cross-section views along plane AA of FIGS. 9A and 9B; and FIGS. 11A to 15A and 11B to 15B are cross-section views along plane AA of FIGS. 9A and 9B, showing successive steps of a mode of simultaneous manufacturing of left-hand and right-hand pixels.

DETAILED DESCRIPTION OF THE DRAWINGS

Figure 1:
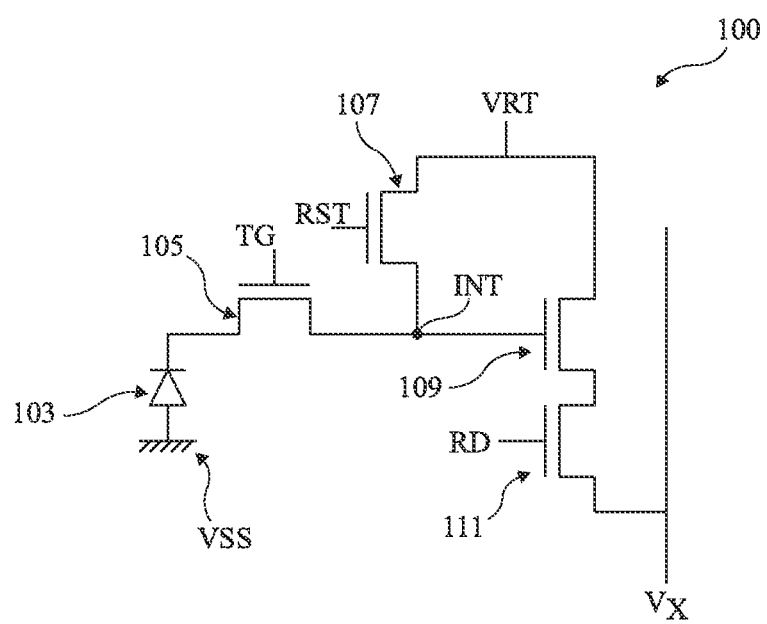
FIG. 1, previously described, shows an example of a pixel read circuit.

For clarity, the same elements have been designated with the same reference numerals in the various drawings and, further, the various drawings are not to scale.

Figure 2A:
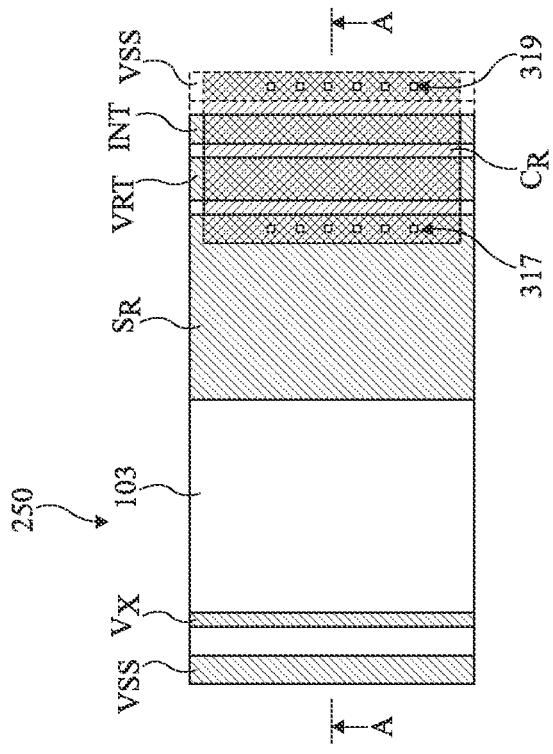
FIGS. 2A and 2B are top views showing a left-hand pixel and a right-hand pixel.
Figure 2B:
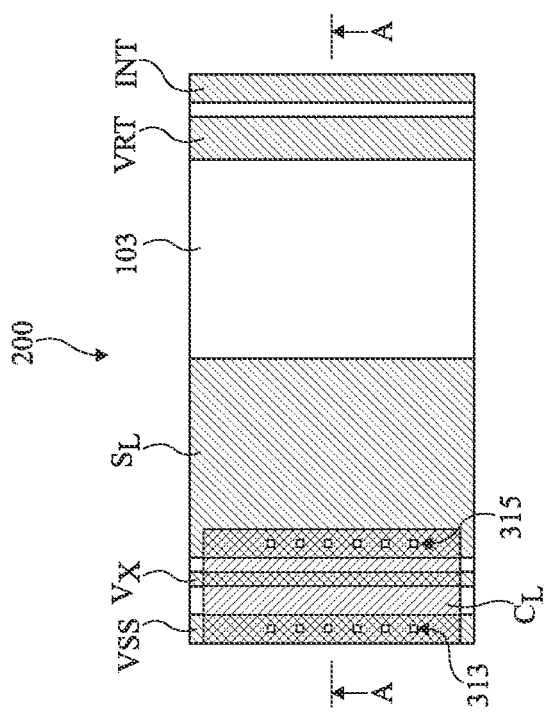
Figure 3A:
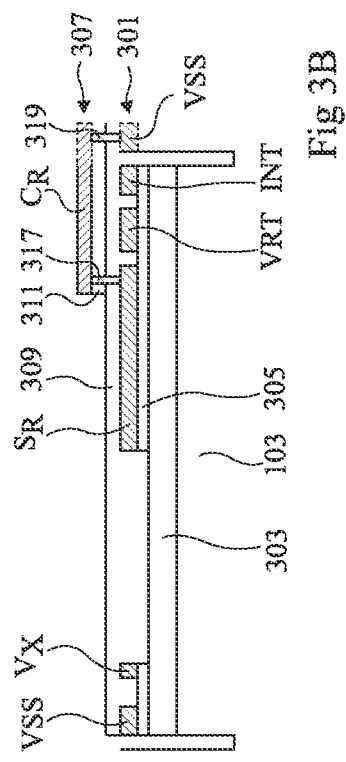
FIGS. 3A and 3B are cross-section views along plane AA of FIGS. 2A and 2B.
Figure 3B:
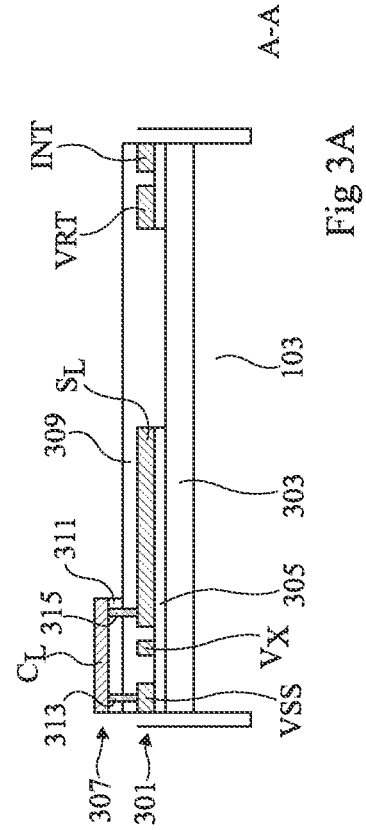

FIGS. 2A and 2B are top views showing a left-hand pixel 200 and a right-hand pixel 250. FIGS. 3A and 3B are cross-section views along plane AA of FIGS. 2A and 2B. The elements specific to a left-hand pixel are marked with an index L and the elements specific to a right-hand pixel are marked with an index R.

Each pixel comprises a first metal level 301 covering two insulating layers 303 and 305 coating a photodiode 103. A second metal level 307 is separated from first metal level 301 by two insulating layers 309 and 311.

In first metal level 301 are particularly formed a shield S (respectively $S_L$ and $S_R$) and lines towards voltages and nodes VSS, $V_X$, VRT, and INT of read circuit 100 of FIG. 1. Second metal level 307 particularly has a connection area C (respectively $C_L$ and $C_R$) formed therein. Connection area $C_L$ is connected on the one hand to line VSS by vias 313 and on the other hand to shield $S_L$ by vias 315. Connection area $C_R$ is connected on the one hand to shield $S_R$ by vias 317 and on the other hand to line VSS of an adjacent pixel to the right of the right-hand pixel by vias 319. Lines VSS, $V_X$, VRT, and INT of pixels 200 and 250 have the same topology.

Line VSS is located on the left-hand side of the pixel and line $V_X$ is located next to line VSS. Line INT is located to the right of the pixel and line VRT is located to the left of line INT. In the case of the left-hand pixel, shield $S_L$ is located to the right of line $V_X$. In the case of the right-hand pixel, shield $S_R$ is located to the left of line VRT. Lines VSS, $V_X$, VRT, and INT cross each pixel to be connected to the other elements (not shown herein) of circuit 100 of FIG. 1.

FIGS. 4A to 8A and 4B to 8B are cross-section views along plane AA of FIGS. 2A and 2B, showing successive steps of an example of manufacturing of a left-hand pixel 200 and of a right-hand pixel 250.

At the step illustrated in FIGS. 4A and 4B, first metal level 301 is deposited on insulating layers 303 and 305 coating photodiode 103. In first metal level 301 are formed, according to the pattern of a first mask, shields S (respectively $S_L$ and $S_R$) and lines VSS, $V_X$, VRT, and INT. The shields cover substantially complementary portions of the photodiodes of pixels 200 and 250.

At the step illustrated in FIGS. 5A and 5B, insulating layer 305 is removed, according to the pattern of a second mask, between shield $S_L$ and line VRT of the left-hand pixel, and between shield $S_R$ and line $V_X$ of the right-hand pixel.

At the step illustrated in FIGS. 6A and 6B, insulating layers 309 and 311 are deposited and vias 313, 315, 317, and 319 are defined according to the pattern of a third mask.

At the step illustrated in FIGS. 7A and 7B, second metal level 307 is deposited. In second metal level 307, connection area $C_L$ is formed so that it is in contact with vias 313 and 315, and connection area $C_R$ is formed so that it is in contact with vias 317 and 319. The connection areas are formed according to the pattern of a fourth mask.

At the step illustrated in FIGS. 8A and 8B, insulating layer 311 is removed, according to the pattern of a fifth mask, between connection area C (respectively $C_L$ and $C_R$) and the pixel edge.

It should be noted that the patterns of the five above-mentioned masks have different topologies for the left-hand and right-hand pixels.

As a result of the foregoing, to manufacture a first and a second pixel arrays comprising left-hand 200 and right-hand 250 pixels distributed differently in determined cells, a component manufacturer should design and manufacture five specific masks for each array, which is expensive.

FIGS. 9A and 9B are top views showing an embodiment of a left-hand pixel 400 and of a right-hand pixel 450. FIGS. 10A and 10B are cross-section views along plane AA of FIGS. 9A and 9B. The elements specific to a left-hand pixel are marked with an index L and the elements specific to a right-hand pixel are marked with an index R.

Each pixel comprises a first metal level 401 covering two insulating layers 403 and 405 coating a photodiode 103. A second metal level 407 is separated from first metal level 401 by two insulating layers 409 and 411.

In first metal level 401 are particularly formed shields S (respectively $S_L$ and $S_R$) and lines towards voltages and nodes VSS, $V_X$, VRT, and INT of read circuit 100 of FIG. 1. Shields S and lines VSS, $V_X$, VRT, INT have the same topology as in the case of FIGS. 2A, 2B and 3A, 3B. These elements will thus not be described again.

Further, first metal level 401 comprises lines D (respectively $D_L$ and $D_R$). Line $D_L$ is located to the left of line VRT while line $D_R$ is located to the right of line $V_X$. Line $D_L$ is formed on a surface of the left-hand pixel corresponding to a portion of the surface occupied by shield $S_R$ in the right-hand pixel. Line $D_R$ is formed on a surface of the right-hand pixel corresponding to a portion of the surface occupied by shield $S_L$ in the left-hand pixel. The provision of lines $D_L$ and $D_R$ enables, as will be seen hereafter, to define vias at the same locations in the left-hand and right-hand pixels.

In second metal level 407 are formed connection areas $C1_L$ and $C2_R$ respectively corresponding to connection areas $C_L$ and $C_R$ of FIGS. 2A, 3A and 2B, 3B. These elements will thus not be described again.

Further, in second metal level 407 are formed a connection area $C2_L$ in the left-hand pixel and a connection area $C1_R$ in the right-hand pixel. Connection area $C2_L$ has the same topology as connection area $C2_R$ and connection area $C1_R$ has the same topology as connection area $C1_L$.

Connection areas $C1_L$ and $C2_R$ are connected to the first metal level by vias $413_L$, $415_L$, $417_R$ and $419_R$ corresponding to vias 313, 315, 317, and 319 defined in left-hand 200 and right-hand 250 pixels of FIGS. 2A, 3A and 2B, 3B. The connections between connection areas $C1_L$, $C2_R$ and the first metal level will not be described again.

Further, connection areas $C2_L$ and $C1_R$ are connected to the first metal level, on the one hand, by vias $417_L$, $419_L$, and on the other hand by vias $413_R$ and $415_R$. Vias $417_L$ and $419_L$ connect connection area $C2_L$, respectively, to line $D_L$ and to line VSS of the adjacent pixel to the right of the left-hand pixel. Vias $417_L$ and $419_L$ connect connection area $C1_R$, respectively, to line VSS and to line $D_R$. Vias $417_L$ and $419_L$ are defined at the same locations in the left-hand pixel as vias $417_R$ and $419_R$ in the right-hand pixel. Vias $413_R$ and $415_R$ are defined at the same locations in the right-hand pixel as vias $413_L$ and $415_L$ in the left-hand pixel.

FIGS. 11A to 15A and 11B to 15B are cross-section views along plane AA of FIGS. 9A and 9B, showing successive steps of a mode of simultaneous manufacturing of left-hand 400 and right-hand 450 pixels.

At the step illustrated in FIGS. 11A and 11B, first metal level 401 has been deposited on insulating layers 403 and 405 coating photodiode 103. In first metal level 401 are formed, according to the pattern of a first mask, shields S (respectively $S_L$ and $S_R$) and lines D (respectively, DL and DR) VSS, $V_X$, VRT, and INT. Shields $S_L$, and $S_R$ cover substantially complementary portions of the photodiodes of pixels 400 and 450.

At the step illustrated in FIGS. 12A and 12B, insulating layer 405 is removed, according to the pattern of a second mask, between shield $S_L$ and line DL of the left-hand pixel, and between shield $S_R$ and line DR of the right-hand pixel.

At the step illustrated in FIGS. 13A and 13B, insulating layers 409 and 411 are deposited and vias 413, 415, 417, and 419 are defined according to the pattern of a third mask. Vias $413_L$ and $413_R$ are in contact with lines VSS. Vias $415_L$ and $415_R$ are in contact, respectively, with shield $S_L$ and line $D_R$. Vias $417_L$ and $417_R$ are in contact, respectively, with line $D_L$ and shield $S_R$. Vias $419_L$ and $419_R$ are in contact with lines VSS of the adjacent pixels to the right of the left-hand and right-hand pixels.

At the step illustrated in FIGS. 14A and 14B, second metal level 407 is deposited. In second metal level 407, according to a pattern of a fourth mask, connection areas $C1_L$ and $C1_R$ are formed in such a way that they are in contact with vias 413 and 415, and connection areas $C2_L$ and $C2_R$ are formed in such a way that they are in contact with vias 417 and 419.

At the step illustrated in FIGS. 15A and 15B, insulating layer 411 is removed between shields C1 and C2 according to the pattern of a fifth mask.

It should be noted that the patterns of the first and second above-mentioned masks have different topologies for the left-hand and right-hand pixels while the patterns of the third, fourth, and fifth above-mentioned masks have the same topology for the left-hand and right-hand pixels. Thus, to pass from a first pixel array to a second pixel array comprising a different distribution of left-hand 400 and right-hand 450 pixels inside of determined cells, the component manufacturer only has to design and manufacture two specific masks (and not five as in the case of the example of FIGS. 2A to 8B).

It has been considered herein that insulating layers 405 and 411 have refraction indexes different from the refraction indexes of insulating layers 403 and 409. To avoid optical losses, it has thus been provided herein to remove layers 405 and 411 above the active area of the photodiodes. If such a removal is not desired to be performed (for example, in the case where insulating layers 403, 405, 409, and 411 have close refraction indexes), the method of FIGS. 2A and 8B will require three specific masks, while the method of FIGS. 9A to 15B will require a single specific mask.

Hereafter, dimensions taken along the horizontal axis of FIGS. 9A and 9B will be called "lengths", and dimensions taken along the vertical axis of FIGS. 9A and 9B will be called "widths".

As a numerical example, the length of the photodiode of a pixel is in the range from 2 to 6 µm, for example, 4.1 µm. The length of connection area C1 is in the range from 500 and 800 nm, for example, 700 nm. The length of connection area C2 is in the range from 500 and 800 nm, for example, 600 nm. The length of a shield corresponds to half the length between areas C1 and C2, in the present case, 1.4 µm. The width of a pixel is in the range from 2 to 6 µm, for example, 4.1 µm. The width of a photodiode of a pixel is in the range from 2 and 3.2 µm, for example, 2.4 µm, for a pixel having a 4.1 µm side length.

Specific embodiments have been described. Various alterations, modifications, and improvements will readily occur to those skilled in the art.

In particular, although self-focusing pixels respectively shielded to the right and to the left have been described herein, other configurations with complementary shields may be provided, for example, self-focusing pixels respectively shielded on the top and at the bottom.

Further, it has been indicated at various steps of the previous description that layer 305 is selectively etched over layer 303. This may result from the fact that the layers are made of different materials, for example, made of silicon nitride and of silicon oxide. It may also be provided for the two layers to be of same nature, for example, made of silicon nitride, and for an etch stop layer to be provided therebetween. The same observation applies to layers 403 and 405.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

The invention claimed is:

1. A method of simultaneously manufacturing a first pixel and a second pixel respectively shielded on a first side and on a second side, comprising the steps of:
    a) depositing a first insulator on an active area;
    b) depositing a first metal level and defining therein, with a first mask, the following horizontal coplanar structures;
        a first shield on the first side of the first pixel,
        a second shield on the second side of the second pixel,
        a first line on the second side of the first pixel opposite to the first shield,
        a second line on the first side of the second pixel opposite to the second shield,
        a third line on the first side of the first pixel between an outer limit of the first shield and an outer limit of the first pixel, and
        a fourth line on the first side of the second pixel between an outer limit of the second line and an outer limit of the second pixel;
    c) depositing a second insulator and defining therein, with a second mask, openings for vias crossing the second insulator to contact the first and second shields and the first, second, third and fourth lines; and
    d) depositing a second metal level and defining therein, with a third mask, two connection areas covering the via openings on each side of the first and second pixels, wherein each of the second and third masks is identical for the first and second pixels.

2. The method of claim 1, wherein the first insulator comprises a first insulating layer covered with a second insulating layer, and the second insulator comprises a third insulating layer, the method further comprising the steps of:

e) etching, with a fourth mask, between steps b) and c), the second insulating layer between the shield and the line; and f) etching, with a fifth mask, after step d), the third insulating layer between connections areas, wherein the fifth mask is identical for the first and second pixels.

3. The method of claim 1, wherein the coplanar structures further include additional lines on the second side of the second pixel between an outer limit of the second shield and another outer limit of the second pixel, and on the second side of the first pixel between the first line and another outer limit of the first pixel.

4. A method, comprising:

forming a first insulating layer over a first pixel area and a second pixel area, each pixel area having a first side and a second side;

forming on the first insulating layer the following horizontal coplanar structures:

a first shield over the first side of the first pixel area and a second shield over the second side of the second pixel area; forming on the first insulating layer a first line over the second side of the first pixel area and a second line over the first side of the second pixel area; and forming on the first insulating layer a third line over the first side of the first pixel between an outer limit of the first shield and an outer limit of the first pixel and a fourth line over the first side of the second pixel between an outer limit of the second line and an outer limit of the second pixel;

forming a first set of vias on the first shield;

forming a second set of vias on the second shield;

forming a third set of vias on the first line; and forming a fourth set of vias on the second line;

wherein the first and third sets of vias are spaced from a center of the first pixel area by a same distance; and wherein the second and fourth sets of vias are spaced from a center of the second pixel area by said same distance.

5. The method of claim 4, further comprising:

forming a second insulating layer over the first and second shields and first through fourth metal lines;

forming on the second insulating layer a first metal layer over the first side of the first pixel area that is electrically connected to the first set of vias; and forming on the second insulating layer a second metal layer over the first side of the second pixel area that is electrically connected to the fourth set of vias.

6. The method of claim 5, further comprising:

using a mask to define the first metal layer; and using the same mask to define the second metal layer.

7. The method of claim 4, further comprising:

forming a second insulating layer over the first and second shields and first through fourth metal lines;

forming on the second insulating layer a first metal layer over the second side of the first pixel area that is electrically connected to the third set of vias; and forming on the second insulating layer a second metal layer over the second side of the second pixel area that is electrically connected to the second set of vias.

8. The method of claim 7, further comprising:

forming on the second insulating layer a third metal layer over the first side of the first pixel area that is electrically connected to the first set of vias; and forming on the second insulating layer a fourth metal layer over the first side of the second pixel area that is electrically connected to the fourth set of vias.

9. The method of claim 8, wherein the first shield and first metal layer cover at least one-half of the first pixel area; and wherein the second shield and second metal layer cover at least one-half of the second pixel area.

10. The method of claim 8, further comprising:

using a mask to define the first and third metal layers over the first pixel area; and using the same mask to define the second and fourth metal layers over the second pixel area.

11. The method of claim 4, further comprising:

defining openings in an overlying insulating layer for the first and third sets of vias using a mask; and defining openings in said overlying insulating layer for the second and fourth sets of vias using said same mask.

12. The method of claim 4, further comprising:

etching the first insulating layer in an area between the first shield and first line; and etching the first insulating layer in an area between the second shield and second line.

13. The method of claim 12, further comprising filling the areas between the shields and lines with an insulating material that covers the shields and lines.

14. The method of claim 4, further comprising:

forming one or more first additional lines on the first insulating layer over the first side of the first pixel area between the first shield and the outer edge of the first pixel area; and forming one or more second additional lines on the first insulating layer over the second side of the second pixel area between the second shield and the outer edge of the second pixel area.

15. The method of claim 14, further comprising:

electrically connecting one of the first additional lines to the first shield by way of a fifth set of vias; and electrically connecting one of the second additional lines to the second shield by way of a sixth set of vias.

16. The method of claim 4, further comprising:

forming one or more first additional lines on the first insulating layer in the second side of the first pixel area between the first line and another outer edge of the first pixel area; and forming one or more second additional lines on the first insulating layer in the first side of the second pixel area between the second line and another outer edge of the second pixel area.

* * * * *